US012796431B2

(12) United States Patent
Chang et al.

(10) Patent No.: US 12,796,431 B2
(45) Date of Patent: Nov. 10, 2026

(54) TSV STRUCTURE AND FABRICATING METHOD OF THE SAME

(71) Applicant: UNITED MICROELECTRONICS CORP., Hsin-Chu City (TW)

(72) Inventors: Chich-Neng Chang, Pingtung County (TW); Fu-Yu Tsai, Tainan City (TW); Da-Jun Lin, Kaohsiung City (TW); Bin-Siang Tsai, Changhua County (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 324 days.

(21) Appl. No.: 18/740,566

(22) Filed: Jun. 12, 2024

(65) Prior Publication Data

US 2025/0329613 A1 Oct. 23, 2025

(30) Foreign Application Priority Data

Apr. 19, 2024 (TW) ................................ 113114597

(51) Int. Cl.

| | |
|---|---|
| ***H10W 20/20*** | (2026.01) |
| ***H10W 20/00*** | (2026.01) |
| ***H10W 20/41*** | (2026.01) |
| ***H10W 20/47*** | (2026.01) |

(52) U.S. Cl.

CPC ......... *H10W 20/20* (2026.01); *H10W 20/023* (2026.01); *H10W 20/076* (2026.01); *H10W 20/425* (2026.01); *H10W 20/47* (2026.01)

(58) Field of Classification Search

CPC ... H10W 20/20; H10W 20/425; H10W 20/47; H10W 20/076; H10W 20/023

USPC .......................................................... 257/751

See application file for complete search history.

(56) References Cited

U.S. PATENT DOCUMENTS 7,189,658 B2 3/2007 Lakshmanan
2004/0005753 A1* 1/2004 Kostamo ................. C23C 16/40 257/E21.171
2006/0003596 A1* 1/2006 Fucsko ............... H10P 14/6308 438/758
2009/0026587 A1 1/2009 Angyal
2015/0108646 A1* 4/2015 Chae ................... H10W 20/033 438/653
2020/0020733 A1* 1/2020 Fujii ...................... H04N 25/70

* cited by examiner

*Primary Examiner* — Phuc T Dang
(74) *Attorney, Agent, or Firm* — Winston Hsu

(57) ABSTRACT

A through silicon via structure includes a semiconductor substrate. A via hole penetrates the semiconductor substrate. A copper layer is disposed in the via hole. A diffusion block layer is disposed in the via hole, wherein the diffusion block layer surrounds and contacts the copper layer. A silicon oxide stack is disposed in the via hole, wherein the silicon oxide stack surrounds and contacts the diffusion block layer and the silicon oxide stack contacts the semiconductor substrate. The concentration of oxygen atoms in the silicon oxide stack decreases along a direction which is from the diffusion block layer toward the semiconductor substrate.

18 Claims, 5 Drawing Sheets

TSV STRUCTURE AND FABRICATING METHOD OF THE SAME

BACKGROUND OF THE INVENTION

1. Field of the Invention

The present invention relates to a through silicon via (TSV) structure and a fabricating method thereof, and in particular to a structure that reduces the stress difference between the TSV and its surrounding silicon oxide liner to avoid cracks

2. Description of the Prior Art

Manufacturing more reliable, lightweight, compact, fast, versatile, and efficient low-cost semiconductor products has always been an important goal of the electronics industry. With the development of highly integrated semiconductor products, the number of input/output pins has increased significantly. The technology of connecting semiconductor chips by using through silicon via (TSV) structures with small pitches has been widely developed. In these package structures, the connection between wafers is achieved by the TSV structures, which is a conductive via structure that penetrates through the entire substrate to provide electrical paths.

However, the stress difference between the conductive material in the TSV and the surrounding material layer is large, so cracks or delamination often occur.

SUMMARY OF THE INVENTION

In view of this, the present invention provides a structure and a fabricating method for reducing the stress difference around the TSV to solve the above problems.

According to a first preferred embodiment of the present invention, a TSV structure includes a semiconductor substrate. A via hole penetrates through the semiconductor substrate. A copper layer is disposed in the via hole. A diffusion block layer is disposed in the via hole, wherein the diffusion block layer surrounds and contacts the copper layer. A silicon oxide stack is disposed in the via hole, wherein the silicon oxide stack surrounds and contacts the diffusion block layer, the silicon oxide stack contacts the semiconductor substrate, a concentration of oxygen atoms in the silicon oxide stack decreases along a direction, and the direction points from the diffusion block layer toward the semiconductor substrate.

According to a second preferred embodiment of the present invention, a fabricating method of a TSV structure includes providing a semiconductor substrate. Then, a TSV is formed to penertrate the substrate, wherein the TSV includes a via hole penetrating through the semiconductor substrate. A copper layer is disposed in the via hole. A diffusion block layer is disposed in the via hole, wherein the diffusion block layer surrounds and contacts the copper layer. A silicon oxide stack is disposed in the via hole, wherein the silicon oxide stack surrounds and contacts the diffusion block layer, the silicon oxide stack contacts the semiconductor substrate, a concentration of oxygen atoms in the silicon oxide stack decreases along a direction, and the direction points from the diffusion block layer toward the semiconductor substrate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 4 depict a fabricating method of a TSV structure according to a first preferred embodiment of the present invention, wherein:

FIG. 1 depicts a semiconductor substrate with a recess;

FIG. 2 is a fabricating stage in continuous of FIG. 1;

FIG. 3 is a fabricating stage in continuous of FIG. 2; and

FIG. 4 is a fabricating stage in continuous of FIG. 3.

FIG. 7 to FIG. 8 depict a fabricating method of a TSV structure according to a second preferred embodiment of the present invention, wherein:

FIG. 7 depicts a semiconductor substrate with a recess;

FIG. 8 is a fabricating stage in continuous of FIG. 7.

DETAILED DESCRIPTION

FIG. 1 to FIG. 4 depict a fabricating method of a TSV structure according to a first preferred embodiment of the present invention.

Figure 1:
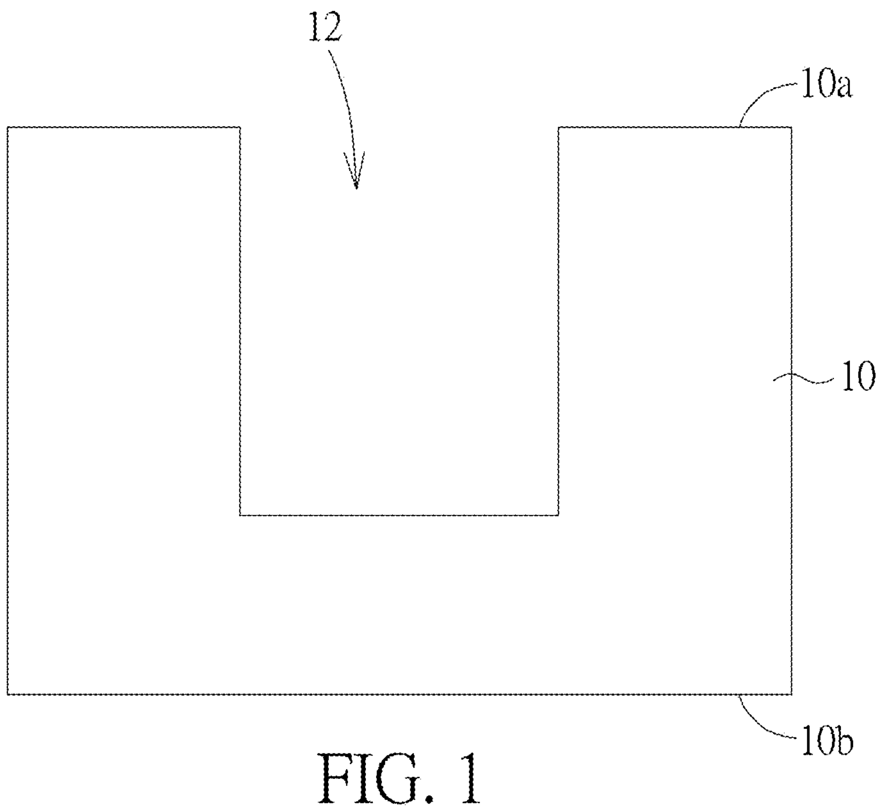
Figure 2:
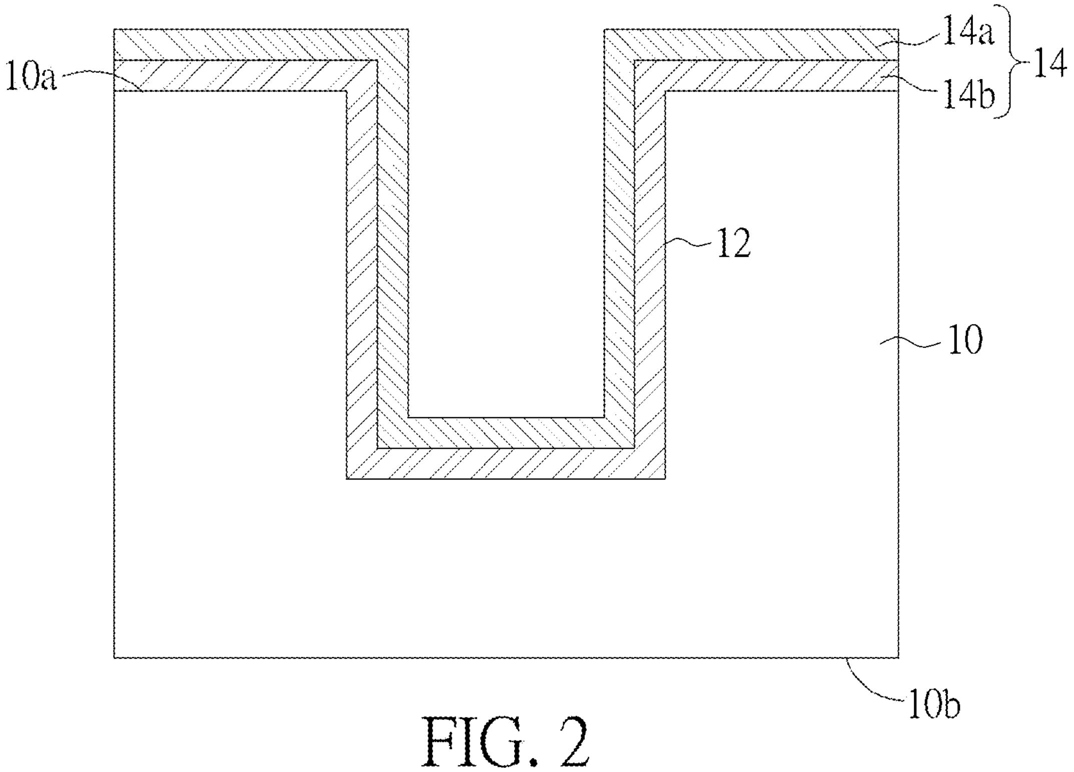

As shown in FIG. 1, a semiconductor substrate 10 is provided. The semiconductor substrate 10 includes a front surface 10*a* and a back surface 10*b*. The front surface 10*a* of the semiconductor substrate 10 is then etched to form a recess 12 in the semiconductor substrate 10. As shown in FIG. 2, a silicon oxide stack 14 is formed to conformally cover the recess 12 and the semiconductor substrate 10. The silicon oxide stack 14 will serve as a silicon oxide liner of the TSV structure. In the first preferred embodiment, the silicon oxide stack 14 is divided into a second silicon oxide layer 14*b* and a first silicon oxide layer 14*a*. The second silicon oxide layer 14*b* and the first silicon oxide layer 14*a* are formed by sequentially forming the second silicon oxide layer 14*b* and the first silicon oxide layer 14*a* to conformally cover the recess 12 and the semiconductor substrate 10. The first silicon oxide layer 14*a* and the second silicon oxide layer 14*b* can be formed by a chemical vapor deposition, a physical vapor deposition or an atomic layer deposition. In this embodiment, the first silicon oxide layer 14*a* and the second silicon oxide layer 14*b* are preferably formed by the atomic layer deposition.

Figure 3:
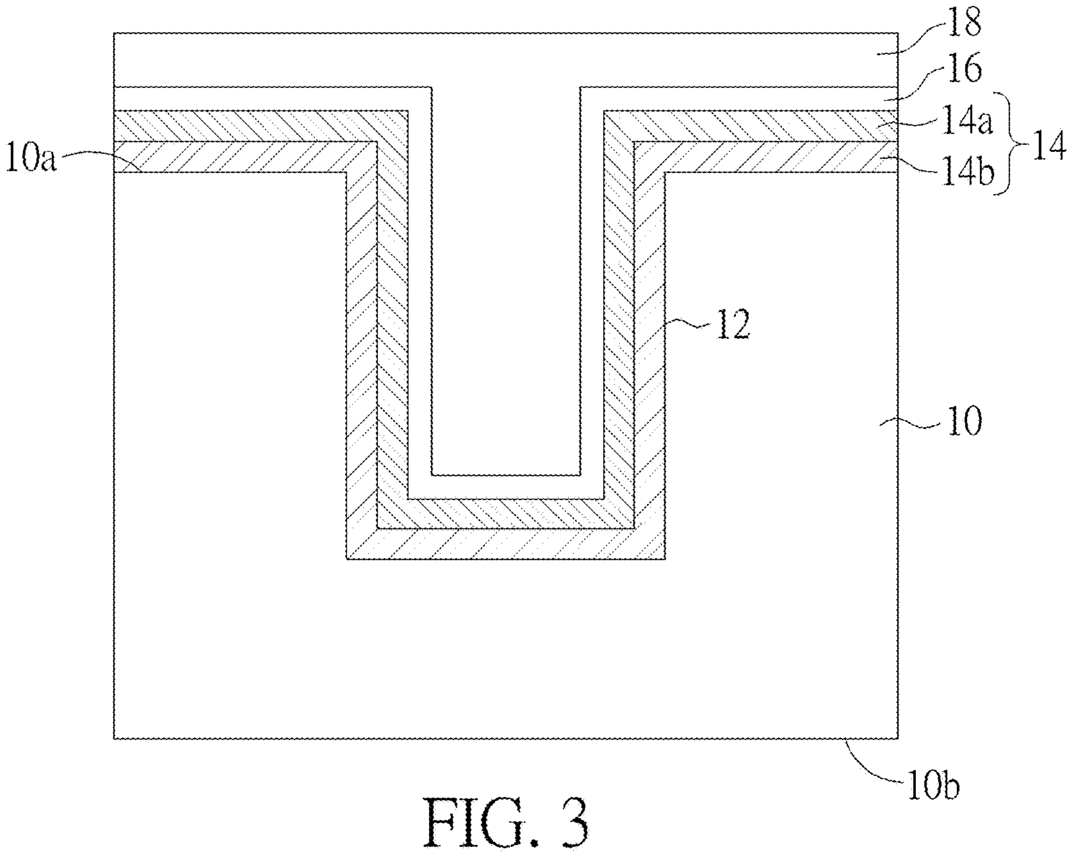
Figure 4:
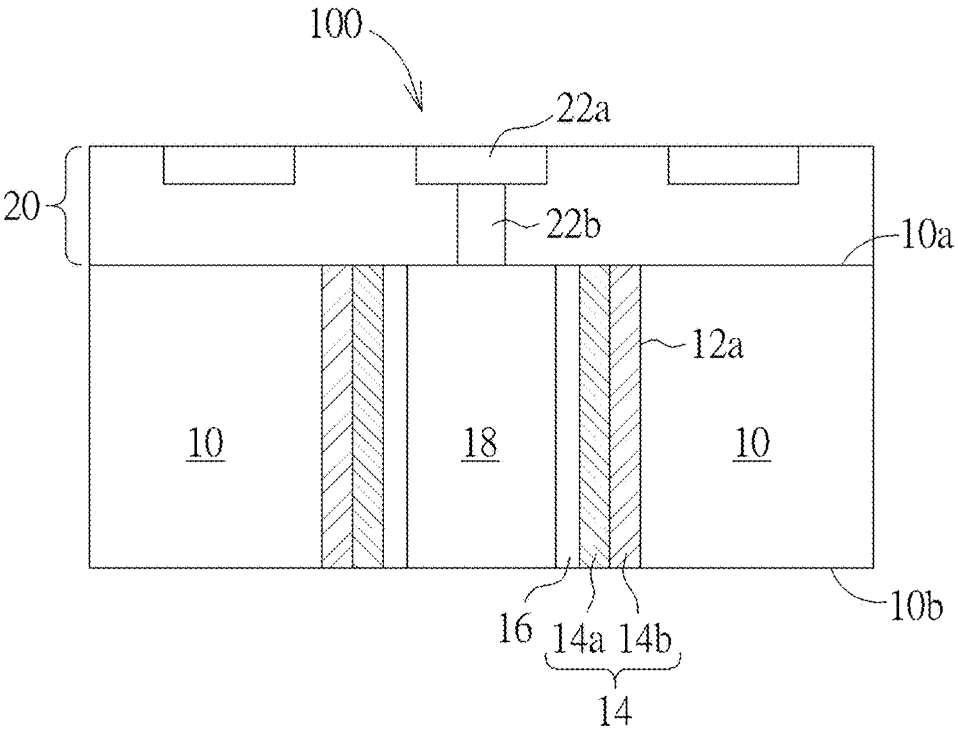

As shown in FIG. 3, a diffusion block layer 16 is formed to cover the first silicon oxide layer 14*a*. The diffusion block layer 16 can be formed by a chemical vapor deposition, a physical vapor deposition or an atomic layer deposition. Then, a copper layer 18 is formed to cover the diffusion block layer 16. The copper layer 18 is preferably formed by an electroplating process. As shown in FIG. 4, the copper layer 18, the diffusion block layer 16 and the silicon oxide stack 14 outside of the recess 12 are removed. The removal method may include an etching process or a chemical mechanical polishing process. After removing part of the copper layer 18, part of the diffusion block layer 16 and part of the silicon oxide stack 14, the top surface of the copper layer 18, the top surface of the diffusion block layer 16 and the top surface of the silicon oxide stack 14 are aligned with the top surface of the semiconductor substrate 10. Later, another chip 20 is provided. The chip 20 is bonded to the front surface 10*a* of the semiconductor substrate 10. Numerous metal connections such as metal wires 22*a* and conductive plugs 22*b* are disposed in the chip 20. At least one of the conductive plugs 22*b* contacts the copper layer 18. Then, the back surface 10*b* of the semiconductor substrate 10 is polished until the copper layer 18 is exposed, and the recess 12 becomes a via hole 12*a*. At this point, a TSV structure 100 of the present invention is completed. The TSV structure 100 of the present invention can be used to provide vertical electrical connections between wafers or chips.

When forming the silicon oxide stack 14, the concentration of the oxygen atoms in the silicon oxide stack 14 can be changed by adjusting the operating conditions of the atomic layer deposition. For example, the concentration of the oxygen atoms in the silicon oxide stack 14 can be changed by adjusting the operating power of the atomic layer deposition. Different concentrations of oxygen atoms will cause different compressive stresses in the silicon oxide stack 14. The higher the concentration of oxygen atoms in the silicon oxide stack 14, the smaller the compressive stress in the silicon oxide stack 14. In a first preferred embodiment, the concentration of oxygen atoms in the first silicon oxide layer 14*a* is greater than the concentration of oxygen atoms in the second silicon oxide layer 14*b*. That is, the compressive stress of the first silicon oxide layer 14*a* is smaller than the compressive stress of the second silicon oxide layer 14*b*.

The operating steps of the atomic layer deposition include introducing precursors into the chamber (not shown). Then, inert gas is used to clean the chamber to remove the precursors. Later, reactive gas is introduced into the chamber. In this preferred embodiment of the present invention, the operating pressure of forming the first silicon oxide layer 14*a* is between 2.5 and 5.5 Torr. The operating temperature of forming the first silicon oxide layer 14*a* is between 100 and 400° C. The operating time of forming the first silicon oxide layer 14*a* is between 100 to 800 seconds. The flow rates of precursor, inert gas and reactive gas of forming the first silicon oxide layer 14*a* are all between 500 and 5000 sccm. The operating power of forming the first silicon oxide layer 14*a* is between 1500 to 3000 watts. In this way, the first silicon oxide layer 14*a* formed by conditions listed above may have the following properties including the concentration of the oxygen atoms of the first silicon oxide layer 14*a* is between 2.00 and 2.85 atoms/$cm^3$, and the compressive stress of the first silicon oxide layer 14*a* is between −50 and 250 Mpa. That is, the stress of the first silicon oxide layer 14*a* is between tensile stress 50 Mpa and compressive stress 250 Mpa. On the other hand, the operating pressure of forming the second silicon oxide layer 14*b* is between 2.5 and 5.5 Torr. The operating temperature of forming the second silicon oxide layer 14*b* is between 100 and 400° C. The operating time of forming the second silicon oxide layer 14*b* is between 100 to 800 seconds. The flow rates of precursor, inert gas and reactive gas of forming the second silicon oxide layer 14*b* are all between 500 and 5000 sccm. The operating power of forming the second silicon oxide layer 14*b* is between 3000 to 5500 watts. In this way, the second silicon oxide layer 14*b* formed by conditions listed aboved may have the following properties including the concentration of the oxygen atoms of the second silicon oxide layer 14*b* is between 1.70 and 2.20 atoms/$cm^3$, and the compressive stress of the second silicon oxide layer 14*b* is between 250 and 1000 Mpa. Therefore, silicon oxide layers with different stresses can be obtained by adjusting the operating power.

In the first preferred embodiment, the operating power keeps at a second fixed value when forming the second silicon oxide layer 14*b*, and the operating power is adjusted to a first fixed value when the step of forming the first silicon oxide layer 14*a* begins. In this way, the concentration of oxygen atoms in the second silicon oxide layer 14*b* formed at the second fixed value has a second fixed oxygen atom concentration, and the concentration of oxygen atoms in the first silicon oxide layer 14*a* formed at the first fixed value has a first fixed oxygen atom concentration.

Figure 7:
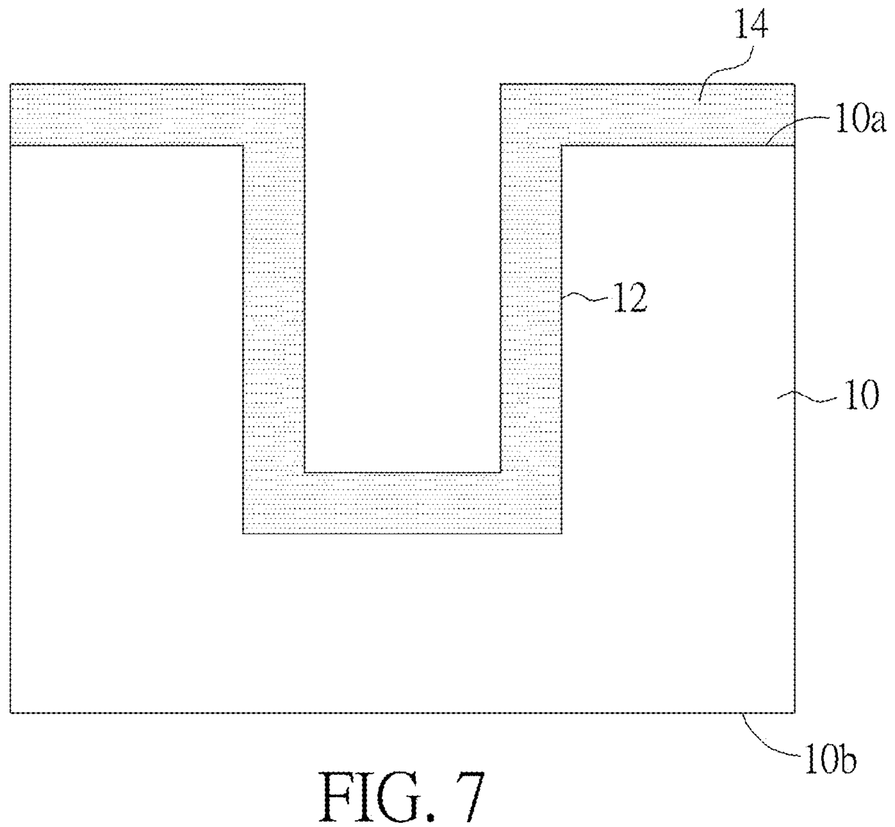
Figure 8:
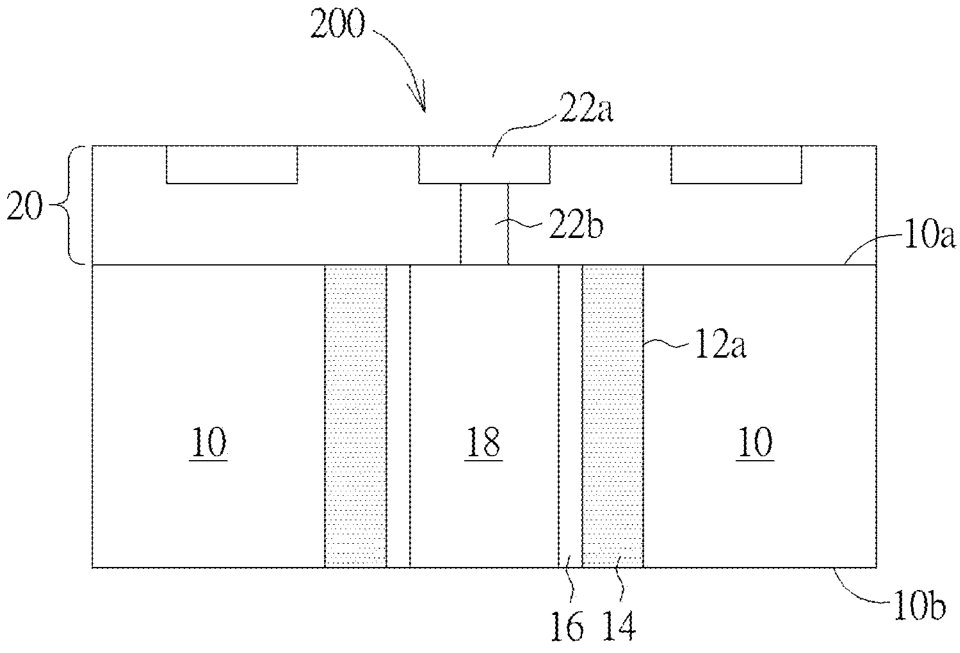

FIG. 7 to FIG. 8 depict a fabricating method of a TSV structure according to a second preferred embodiment of the present invention.

FIG. 7 is depicts steps in continuous of FIG. 1. As shown in FIG. 7, in the second preferred embodiment of the present invention, the silicon oxide stack 14 is formed by continuously and gradually reducing the operating power from the beginning of the atomic layer deposition to form the silicon oxide stack 14 until the silicon oxide stack 14 is completed. Therefore, the concentration of oxygen atoms in the silicon oxide stack 14 continuously and gradually raises as the thickness of the silicon oxide stack 14 increases during the atomic layer deposition. The compressive stress of the silicon oxide stack 14 continuously and gradually decreases as the thickness of the silicon oxide stack 14 increases during the atomic layer deposition. The other process parameters of the silicon oxide stack 14 are the same as those in the first preferred embodiment; an accompanying explanation is therefore omitted. Then, as shown in FIG. 8, a diffusion block layer 16 is formed. Later, a copper layer 18 is formed to cover the diffusion block layer 16. Thereafter, the copper layer 18, the diffusion block layer 16 and the silicon oxide stack 14 outside the recess 12 are removed. Next, another chip 20 is provided to bond to the front surface 10*a* of the semiconductor substrate 10. At least one of the conductive plugs 22*b* in the chip 20 contacts the copper layer 18. Then, the back surface 10*b* of the semiconductor substrate 10 is polished until the copper layer 18 is exposed. At this point, a TSV structure 200 of the present invention is completed.

Figure 5:
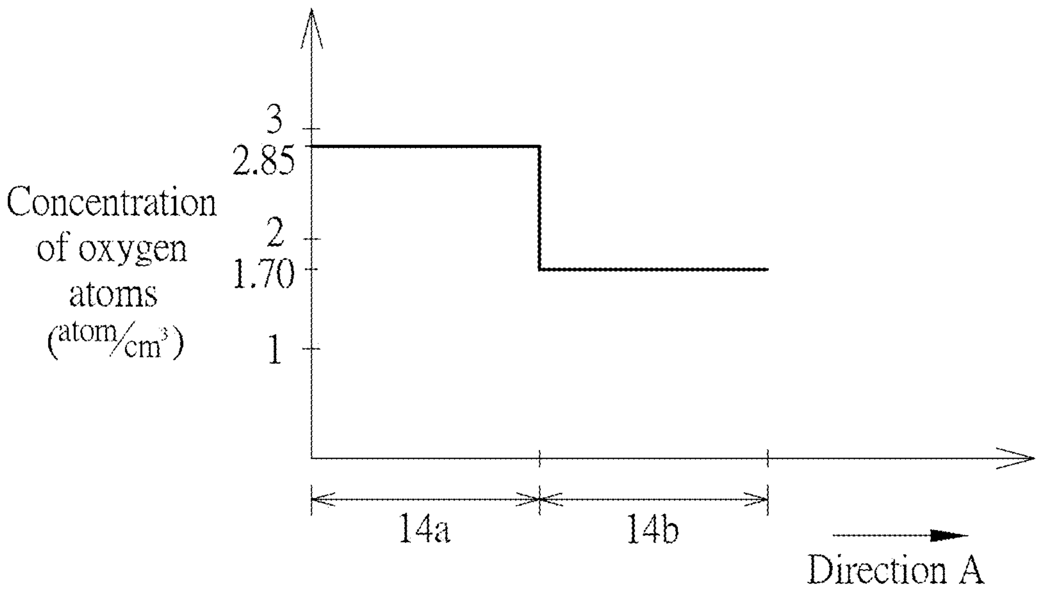
FIG. 5 depicts a concentration variation of oxygen atoms in a silicon oxide stack according to a first preferred embodiment of the present invention.
Figure 6:
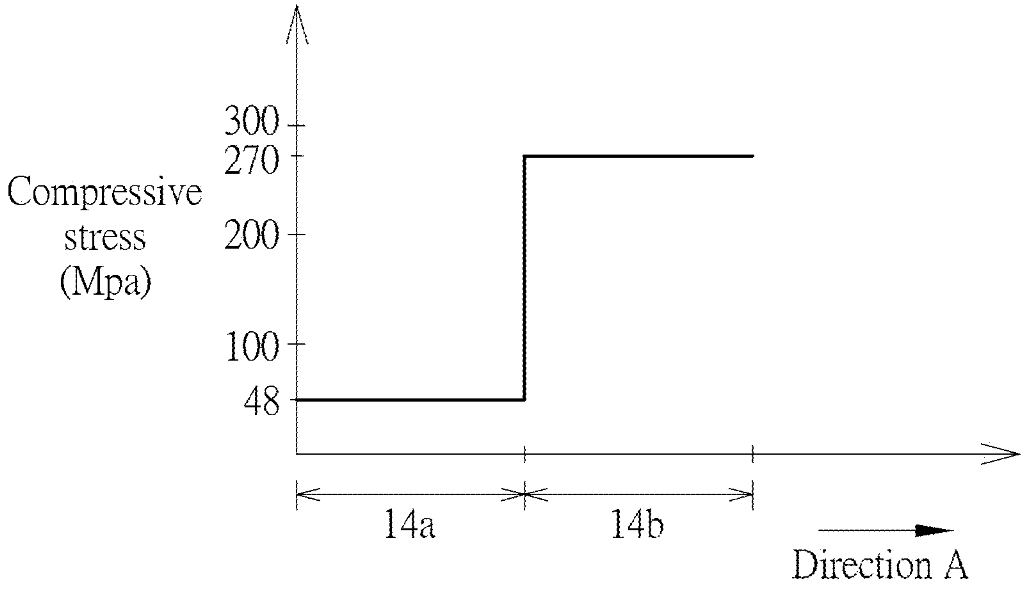
FIG. 6 depicts a stress variation in a silicon oxide stack according to a first preferred embodiment of the present invention.

FIG. 5 depicts a concentration variation of oxygen atoms in a silicon oxide stack according to a first preferred embodiment of the present invention. FIG. 6 depicts a stress variation in a silicon oxide stack according to a first preferred embodiment of the present invention.

Please refer to FIG. 4, FIG. 5 and FIG. 6. The TSV structure 100 of the present invention includes a semiconductor substrate 10. The semiconductor substrate 10 may be a silicon substrate, a germanium substrate, a gallium arsenide substrate, a silicon germanium substrate, an indium phosphide substrate, a gallium nitride substrate, a silicon carbide substrate or a silicon on insulator substrate. A via hole 12*a* penetrates through the semiconductor substrate 10, and a copper layer 18 is disposed in the via hole 12*a*. The copper layer 18 has a tensile stress, and a diffusion block layer 16 is disposed in the via hole 12*a*. The diffusion block layer 16 includes tantalum nitride, tantalum, titanium, titanium nitride, titanium silicon nitride (TiSiN) or tungsten nitride. The diffusion block layer 16 surrounds and contacts copper layer 18. A silicon oxide stack 14 is disposed in the via hole 12*a*, and the silicon oxide stack 14 serves as a silicon oxide liner. In addition, the silicon oxide stack 14 consists of silicon oxide, for example, the the silicon oxide stack 14 includes only silicon dioxide. The silicon oxide stack 14 surrounds and contacts the diffusion block layer 16 and the silicon oxide stack 14 contacts the semiconductor substrate 10. The concentration of oxygen atoms in the silicon oxide stack layer 14 decreases along a direction A. The direction A points from the diffusion block layer 16 toward the semiconductor substrate 10. In the first preferred embodiment, the silicon oxide stack 14 is composed of a first silicon oxide layer 14*a* and a second silicon oxide layer 14*b*. The concentration of oxygen atoms in the second silicon oxide layer 14*b* is a second fixed oxygen atom concentration, and the concentration of oxygen atoms in the first silicon oxide layer 14*a* is a first fixed oxygen atom concentration. The compressive stress of the second silicon oxide layer 14*b* is a second fixed compressive stress, and the compressive stress of the first silicon oxide layer 14*a* is a first fixed compressive stress. For example, the first fixed oxygen atom concentration is 2.85 atoms/$cm^3$, and the second fixed oxygen atom concentration is 1.75 atoms/$cm^3$. Therefore, the concentration of oxygen atoms of the silicon oxide stack 14 decreases in a stepwise manner along the direction A. The first fixed compressive stress is 48 MPa, and the second fixed compressive stress is 270 MPa. Accordingly, the compressive stress of the silicon oxide stack 14 increases in a stepwise manner along the direction A.

In addition, the thickness of the copper layer 18 is preferably between 6 and 10 micrometers. The thickness of the silicon oxide stack 14 is preferably between 100 and 500 nanometers. The thickness of the diffusion block layer 16 is preferably between 30 and 200 nanometers.

Figure 9:
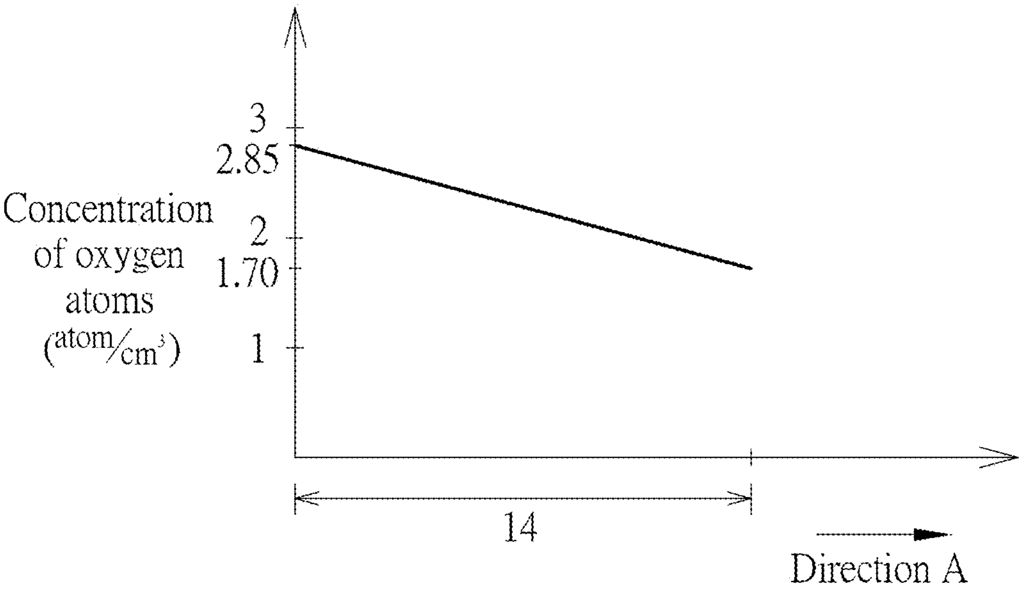
FIG. 9 depicts a concentration variation of oxygen atoms in a silicon oxide stack according to a second preferred embodiment of the present invention.
Figure 10:
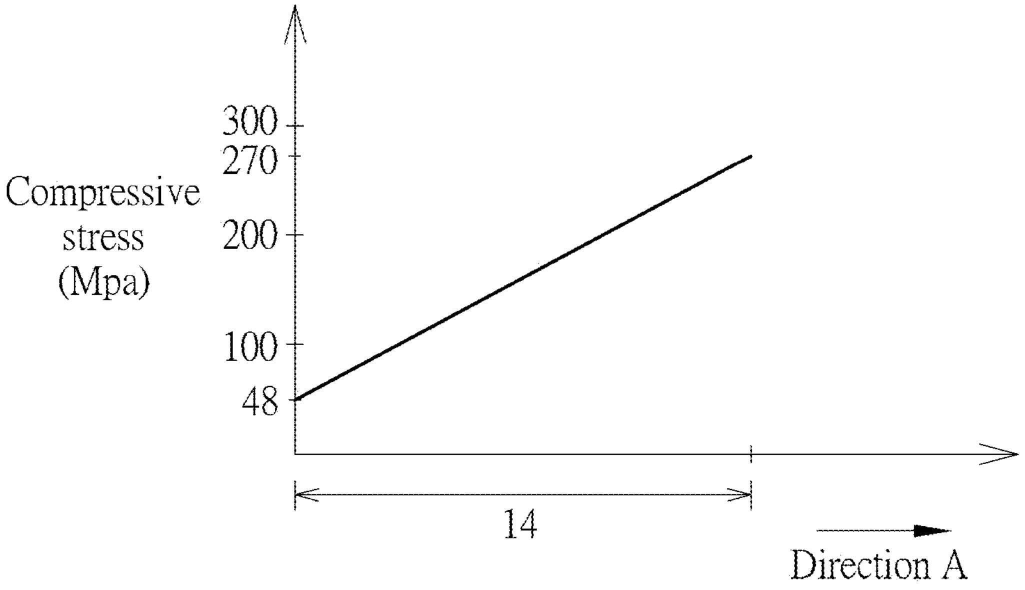
FIG. 10 depicts a stress variation in a silicon oxide stack according to a second preferred embodiment of the present invention.

FIG. 9 depicts a concentration variation of oxygen atoms in a silicon oxide stack according to a second preferred embodiment of the present invention. FIG. 10 depicts a stress variation in a silicon oxide stack according to a second preferred embodiment of the present invention.

Please refer to FIG. 8, FIG. 9 and FIG. 10. The difference between the TSV structure 200 and the TSV structure 100 is that the concentration of oxygen atoms in the silicon oxide stack 14 of the TSV structure 200 decreases continuously along the direction A. For example, the concentration of oxygen atoms in the silicon oxide stack 14 contacting the diffusion block layer 16 is 2.85 atoms/$cm^3$. The concentration of oxygen atoms in the silicon oxide stack 14 contacting the semiconductor substrate 10 is 1.70 atoms/$cm^3$. Along direction A, the concentration of oxygen atoms in the silicon oxide stack 14 continuously decreases from 2.85 atoms/$cm^3$ to 1.70 atoms/$cm^3$. In details, the concentration of oxygen atoms in the silicon oxide stack 14 continuously decreases from the interface between the silicon oxide stack 14 and the diffusion block layer 16 to the interface between the silicon oxide stack 14 and semiconductor substrate 10. Therefore, the compressive stress of the silicon oxide stack 14 continuously increases along the direction A. As shown in FIG. 10, the compressive stress of the silicon oxide stack 14 contacting the diffusion block layer 16 is 48 Mpa. The compressive stress of the silicon oxide stack 14 contacting the semiconductor substrate 10 is 270 Mpa. Along the direction A, the compressive stress continuously increases from 48 MPa to 270 MPa. Other elements of the TSV structure 200 are the same as those in the TSV structure 100; an accompanying explanation is therefore omitted.

Since the copper layer has tensile stress and the silicon oxide stack has compressive stress, the stress difference between the copper layer and the silicon oxide stack is too large. This will cause cracks to occur between the diffusion block layer and the silicon oxide stack. Therefore, the compressive stress of the silicon oxide stack is adjusted to reduce the stress difference between the copper layer and the silicon oxide stack. In this way, cracks or delamination between the diffusion block layer and the silicon oxide stack can be avoided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A through silicon via (TSV) structure, comprising:
- a semiconductor substrate;
- a via hole penetrating through the semiconductor substrate;
- a copper layer disposed in the via hole;
- a diffusion block layer disposed in the via hole, wherein the diffusion block layer surrounds and contacts the copper layer; and
- a silicon oxide stack disposed in the via hole, wherein the silicon oxide stack surrounds and contacts the diffusion block layer, the silicon oxide stack contacts the semiconductor substrate, a concentration of oxygen atoms in the silicon oxide stack decreases along a direction, and the direction points from the diffusion block layer toward the semiconductor substrate, and wherein the silicon oxide stack comprises a first silicon oxide layer and a second silicon oxide layer, the first silicon oxide layer surrounds and contacts the diffusion block layer, the second silicon oxide layer surrounds and contacts the first silicon oxide layer, the second silicon oxide layer contacts the semiconductor substrate, and a concentration of oxygen atoms in the first silicon oxide layer is greater than a concentration of oxygen atoms in the second silicon oxide layer.

2. The TSV structure of claim 1, wherein the first silicon oxide layer has a first compressive stress, the second silicon oxide layer has a second compressive stress, and the first compressive stress is smaller than the second compressive stress.

3. The TSV structure of claim 1, wherein a concentration of oxygen atoms in the silicon oxide stack decreases continuously along the direction.

4. The TSV structure of claim 1, wherein a concentration of oxygen atoms in the silicon oxide stack decreases in a stepwise manner along the direction.

5. The TSV structure of claim 1, wherein the silicon oxide stack has a compressive stress, and the compressive stress increases along the direction.

6. The TSV structure of claim 1, wherein the diffusion block layer comprises tantalum nitride and tantalum.

7. The TSV structure of claim 1, wherein the copper layer has a tensile stress.

8. The TSV structure of claim 1, wherein the silicon oxide stack consists of silicon oxide.

9. The TSV structure of claim 1, wherein the silicon oxide stack is silicon dioxide.

10. A fabricating method of a through silicon via (TSV) structure, comprising:
- providing a semiconductor substrate;
- forming a TSV penetrating the semiconductor substrate, wherein the TSV comprises:
- a via hole penetrating through the semiconductor substrate;
- a copper layer disposed in the via hole;

a diffusion block layer disposed in the via hole, wherein the diffusion block layer surrounds and contacts the copper layer; and a silicon oxide stack disposed in the via hole, wherein the silicon oxide stack surrounds and contacts the diffusion block layer, the silicon oxide stack contacts the semiconductor substrate, a concentration of oxygen atoms in the silicon oxide stack decreases along a direction, and the direction points from the diffusion block layer toward the semiconductor substrate, and wherein the silicon oxide stack comprises a first silicon oxide layer and a second silicon oxide layer, the first silicon oxide layer surrounds and contacts the diffusion block layer, the second silicon oxide layer surrounds and contacts the first silicon oxide layer, the second silicon oxide layer contacts the semiconductor substrate, and a concentration of oxygen atoms in the first silicon oxide layer is greater than a concentration of oxygen atoms in the second silicon oxide layer.

11. The fabricating method of a TSV structure of claim 10, wherein steps of forming the silicon oxide stack comprises:

performing an atomic layer deposition to form the silicon oxide stack, wherein an operating power of the atomic layer deposition decreases as a thickness of the silicon oxide stack increases.

12. The fabricating method of a TSV structure of claim 2, wherein the first silicon oxide layer has a first compressive stress, the second silicon oxide layer has a second compressive stress, and the first compressive stress is smaller than the second compressive stress.

13. The fabricating method of a TSV structure of claim 10, wherein a concentration of oxygen atoms in the silicon oxide stack decreases continuously along the direction.

14. The fabricating method of a TSV structure of claim 10, wherein a concentration of oxygen atoms in the silicon oxide stack decreases in a stepwise manner along the direction.

15. The fabricating method of a TSV structure of claim 10, wherein the silicon oxide stack has a compressive stress, and the compressive stress increases along the direction.

16. The fabricating method of a TSV structure of claim 10, wherein the diffusion block layer comprises tantalum nitride and tantalum.

17. The fabricating method of a TSV structure of claim 10, wherein the copper layer has a tensile stress.

18. The fabricating method of a TSV structure of claim 10, wherein the silicon oxide stack consists of silicon oxide.

* * * * *